United States Patent [19]

Marcus

[11] 4,303,324
[45] Dec. 1, 1981

[54] ANNULAR PIEZOELECTRIC PLASTIC BENDER LENS MOTOR

[75] Inventor: Michael A. Marcus, Rochester, N.Y.

[73] Assignee: Eastman Kodak Company, Rochester, N.Y.

[21] Appl. No.: 194,323

[22] Filed: Oct. 6, 1980

[51] Int. Cl.³ .................. G03B 7/08; G03B 13/02; G02B 7/02
[52] U.S. Cl. .................. 354/195; 350/255; 354/25
[58] Field of Search .................. 350/255, 257; 354/25, 354/135, 234, 235, 195, 196

[56] References Cited

U.S. PATENT DOCUMENTS

| | | | |
|---|---|---|---|
| 4,021,101 | 5/1977 | Camerik | 350/255 |
| 4,083,057 | 4/1978 | Quinn | 354/195 X |
| 4,152,060 | 5/1979 | Specht | 354/195 |
| 4,156,565 | 5/1979 | Harrison | 354/195 X |
| 4,234,245 | 11/1980 | Toda et al. | 354/234 X |

OTHER PUBLICATIONS

"A Piezoelectric Fine-Focusing Optical Mount" by Marshall D. Graham, Review of Scientific Instruments, vol. 45, No. 8, Aug. 1974, pp. 1026-1027.

Primary Examiner—Donald A. Griffin
Attorney, Agent, or Firm—Thomas H. Close

[57] ABSTRACT

A motor for moving a lens element in a photographic camera comprises an annular bender of piezoelectric plastic material such as polyvinylidene fluoride (PVF$_2$). The outside edge of the annular bender is rigidly fixed to the camera, and the movable lens element is flexibly supported inside the annulus. The bender is mounted in the camera such that deflection of the bender produced by a moderately high voltage displaces the lens element along the optical axis of the camera.

4 Claims, 6 Drawing Figures

ANNULAR PIEZOELECTRIC PLASTIC BENDER LENS MOTOR

BACKGROUND OF THE INVENTION

1. Field of the Invention

The present invention relates to photographic cameras, and more particularly, to apparatus for moving a lens element in such cameras.

2. Discussion Related to the Problem

Various schemes have been proposed for automatically determining the required focus adjustment in a photographic camera. A feature common to these schemes is a means for moving a lens element in the camera either during or after focus determination. Other cameras include "zoom" lenses, wherein the magnification of the camera lens is changed by moving an element in the camera lens. Copending U.S. patent application Ser. No. 193,771 entitled "Camera With Electronic Flash and Piezoelectric Lens Motor" by L. F. Frank and J. K. Lee filed Oct. 3, 1980 discloses the use of a piezoelectric motor to move a lens element in a photographic camera having a built-in electronic flash. In cameras having built-in electronic flash, the moderately high voltage power supply for the electronic flash can be employed to power the piezoelectric motor, thereby making the piezoelectric focus motor highly attractive in such cameras. The above-referenced application discloses the use of a piezoelectric motor made of lead zirconate titanate (PZT). These motors rely on the inherent stiffness of PZT to hold a lens element in a camera without sagging appreciably under the influence of gravity.

There has been considerable recent interest in another kind of piezoelectric material called polyvinylidene fluorode ($PVF_2$). $PVF_2$ is a plastic that can be formed and worked in much the same way as other plastics. It is known, for instance, that a $PVF_2$ bender deflects much further under a given electric field than does a PZT bender, thereby eliminating the need for further mechanical amplification of the motion in certain applications of the bender. Since $PVF_2$ can be worked in ways known in plastic manufacturing arts, it would appear to be an ideal piezoelectric material for use in a piezoelectric focus motor. The problem with $PVF_2$ is that it is not nearly as stiff as PZT and a reasonably rigid cantilever beam of $PVF_2$ will not support the weight of a lens element without sagging to an undesirable extent under the influence of gravity.

SOLUTION OF THE PROBLEM—SUMMARY OF THE INVENTION

The above-noted problem is solved according to the present invention by employing an annular bender of piezoelectric plastic (e.g. $PVF_2$) as the focus motor in a photographic camera. The annular bender is comprised of a flat annular body of the suitably poled plastic piezoelectric material and a plurality of electrodes for creating an electric field across the thickness of the material. The outside edge of the annular bender is rigidly secured and the bender is mounted in the camera such that the plane of the annulus is perpendicular to the optical axis of the camera. The outside edge of the annulus is fixed relative to the camera and the movable lens element is flexibly suspended in the hole in the center of the annulus. The annular configuration of the bender provides support for the lens element without sagging under the influence of gravity. When a moderately high voltage (e.g. 200–300 volts DC) is applied to the electrodes of the annular bender, the bender deforms to displace the lens element along the optical axis of the camera.

BRIEF DESCRIPTION OF THE DRAWINGS

The invention will be described with respect to the drawings, wherein.

DESCRIPTION OF THE PREFERRED EMBODIMENTS

Figure 1:
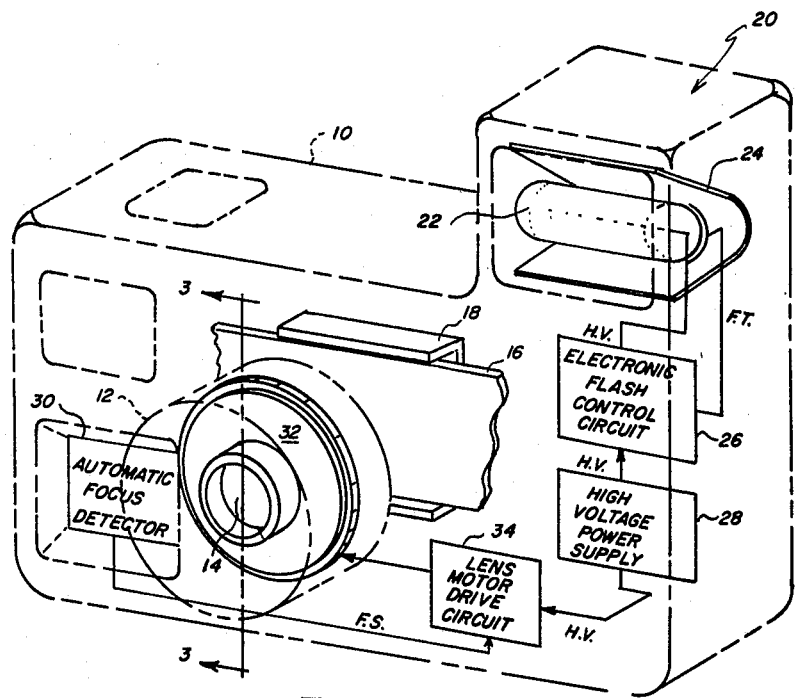
FIG. 1 is a perspective schematic diagram of a photographic camera with electronic flash and having a piezoelectric lens motor according to the present invention.

Referring first to FIG. 1, a photographic camera having an annular piezoelectric plastic bender lens motor according to the invention is shown. The construction of photographic cameras is well known in the art, therefore only those parts cooperating directly with or facilitating the description of the present invention are shown. Parts not shown may be selected from those in the art. The camera includes a body 10, shown in phantom outline, forming a light-tight enclosure for supporting the film and the other parts of the camera. A taking lens, generally designated 12, comprising one or more lens elements of which at least one element is a movable lens element 14, defines the optical axis of the camera and forms an image of a scene on a photosensitive film 16. Movable lens element 14 can be moved back and forth along the optical axis of the camera to change the focus of lens 12. The film is supported in the focal plane of lens 12 by a film supporting structure 18. The movable lens element 14 is moved toward film 16 to focus on objects farther away, and is moved away from film 16 to focus on closer objects.

An electronic flash, generally designated 20, includes a flash tube 22, a reflector 24, an electronic flash control circuit 26, and a high voltage power supply 28. The flash control circuit 26 delivers moderately high voltage power HV (200–300 volts DC) to the flash tube 22 from power supply 28, and also supplies a flash trigger signal FT to the flash tube to initiate a flash.

The camera also includes an automatic focus detector 30 that responds to scene parameters to produce a focus signal FS representing the proper focus adjustment for movable lens element 14. For example, the automatic focus detector may determine the proper focus adjustment by measuring the distance to an object in a central portion of the scene, using either light or sound. Both types of automatic distance measuring systems are well known in the art.

An annular piezoelectric plastic bender lens motor 32 moves lens element 14 to effect changes in focus. Lens motor 32 is supplied with moderately high voltage power from power supply 28 by a lens motor drive circuit 34 which responds to the focus signal FS produced by automatic focus detector 30 to supply controlled amounts of the high voltage power to the lens motor.

Figure 2:
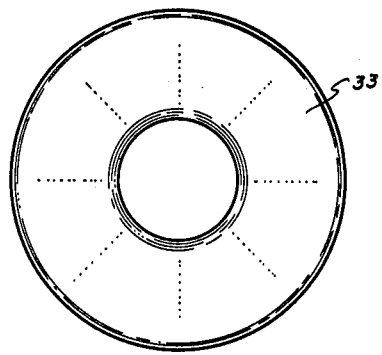
FIG. 2 is a top view of an annular piezoelectric plastic bender according to the present invention.

The lens motor according to the preferred embodiment of the present invention comprises an annular piezoelectric plastic bender of polyvinylidene fluoride (PVF$_2$). FIG. 2 is a top view of the annular piezoelectric plastic bender 33. The annular bender 33 is prepared by vacuum depositing a layer of aluminum (approximately 800 Å thick) onto both sides of a rectangularly shaped piece of 25 micron thick, biaxially stretched, PVF$_2$ film approximately $2\frac{1}{2}''$ by $5''$. The biaxially stretched PVF$_2$ film was purchased from the Kureha Chemical Company. Using the vacuum deposited layers of aluminum as electrodes, the film is poled by applying a field of 0.75 megavolts per cm for 1 hour at 100° C. The rectangular piece of film is then folded and glued together to form a bilayer structure. Eastman 910 adhesive is spread over one side of the rectangular piece of film, the film is folded to form a square, and then run through the nip of a pair of pressure rollers to evenly distribute the adhesive and express any extra adhesive. A circular disc about $1\frac{1}{4}''$ in diameter is cut from the resulting square of material, and a hole approximately $\frac{1}{8}''$ in diameter is punched in the center of the disc. The resulting structure, shown in FIG. 2, is a sandwich of two layers of plastic piezoelectric material poled in opposite directions and having metal electrodes disposed on the top and bottom surfaces and between the two layers of the structure. In a structure where the two layers are poled in opposite directions, only the outside electrodes are used and the configuration is known as a "series" bender.

Figure 3:
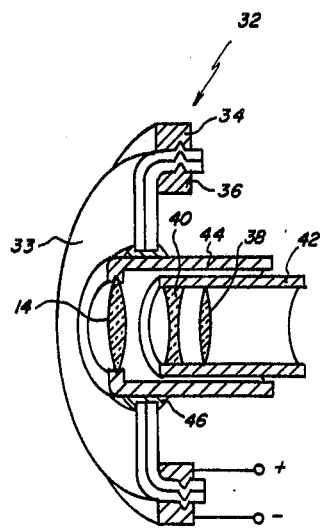
FIG. 3 is perspective view of the annular piezoelectric plastic bender lens motor according to the present invention broken along lines 3—3 in FIG. 1.
Figure 4:
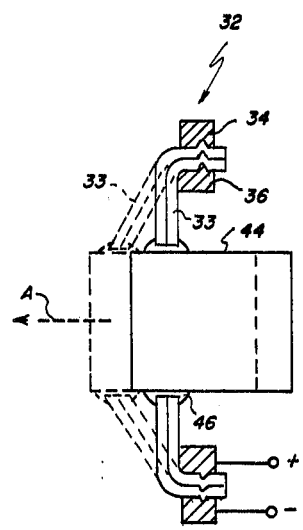
FIG. 4 is a somewhat schematic cross-section of the annular piezoelectric plastic bender lens motor showing lens motion when an electric field is applied across the piezoelectric material.

Referring now to FIG. 3, a portion near the outside edge of the annular piezoelectric bender 33 is clamped in a pair of concentric metal rings 34 and 36, reminiscent of an embroidery hoop. As noted above, in a "series" bender only the outside electrodes are used, the electrodes on the inside of the sandwich were used only for poling the piezoelectric material and are not needed for later operation of the device. The metal rings 34 and 36 provide both mechanical support for the bender and electrical contact to the front and back electrodes, respectively, of the bender. As shown in FIG. 3, lens 12 comprises a relatively fixed set of lens elements 38 and 40 mounted in a lens barrel 42 that is attached to the camera body 10 (not shown), and a movable lens element 14. Lens element 14 is mounted in a lens barrel 44 that is concentric with and slidably movable with respect to fixed lens barrel 42 to effect focus adjustment of lens 12. Movable lens barrel 44 is mounted in the center of the annular piezoelectric plastic bender 33 by means of a bead of flexible rubber adhesive (silicone rubber caulking) 46. When a moderately high voltage is applied across the bender, via contact rings 34 and 36 to the front and back electrodes, the bender deflects by an amount proportional to the field generated by the applied voltage, as shown by dotted lines in FIG. 4, thereby moving lens barrel 44 in the direction of arrow A parallel with the optical axis of the camera.

Figure 5:
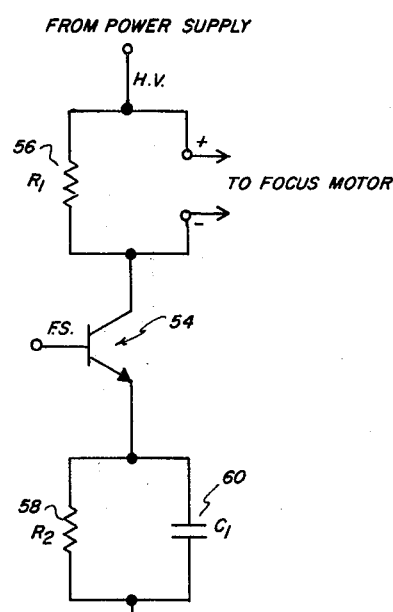
FIG. 5 is a schematic diagram of a lens motor drive circuit usable with the annular piezoelectric plastic bender lens motor according to the present invention.

A focus detector suitable for use with the present invention develops a focus signal FS (0–5 volts) that is proportional to the reciprocal of the distance to the object being focused upon. FIG. 5 is a schematic diagram of a lens motor drive circuit usable with such a focus detector to drive the annular piezoelectric plastic bender lens motor. The focus signal FS is applied to the base of a single high voltage transistor 54 that is operated with emitter/follower type feedback to control the voltage applied to the focus motor from the high voltage power supply 28 (see FIG. 1). The resistances $R_1$ and $R_2$ of resistors 56 and 58 and the capacitance $C_1$ of capacitor 60 are chosen such that the feedback network (resistor 58 and capacitor 60) have the same time constant as the high voltage section of the circuit (resistor 56 and the capacitance of the piezoelectric motor) to minimize the charging time for the annular bender. If the lens element 44 is parked at the hyperfocal distance or far point when the annular piezoelectric bender lens motor is not energized, this circuit provides a maximally fast adjustment to an initial focus position, with somewhat slower accommodation to later changes in focus, since the discharge time of the piezoelectric motor is determined solely by the resistor $R_1$.

Figure 6:
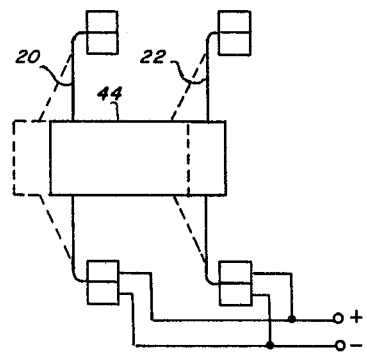
FIG. 6 is a schematic diagram of a lens motor employing two annular piezoelectric plastic benders according to the present invention.

More than one annular piezoelectric plastic bender may be employed in the lens motor. For example, FIG. 6 schematically shows a lens motor comprising two annular benders. The two benders 70 and 72 are electrically connected in parallel to displace lens barrel 44 as shown by the dotted lines in FIG. 6. Use of two benders not only increases the power of the lens motor, but also stabilizes the lens barrel 44 against rotation about any axis parallel to the planes of the benders.

The invention has been described in detail with particular reference to preferred embodiments thereof, but it is understood that changes and modifications may be made within the spirit and scope of the invention. For example, the annular piezoelectric plastic bender, although described as being comprised of two layers of piezoelectric plastic material may be comprised of one layer, or more than two layers. Although a series bender having oppositely poled piezoelectric plastic material was described, a parallel bender having piezoelectric plastic material poled in the same direction could also be used, in which case the center electrode, not used in the embodiment described above, would be used. The field would be applied between the center electrode and the two outside electrodes. Also, to further increase the deflection of the annular piezoelectric plastic bender, the bender may be slit along a plurality of radial lines as indicated by dotted lines in FIG. 2. Furthermore, although the annular piezoelectric plastic lens motor has been disclosed as moving a lens element to change the focus of a camera lens, it could similarly be used to move a lens element to change the magnification of a camera lens in a "zoom" lens system.

I claim:

1. In a photographic camera, a lens motor for moving a lens element along the optical axis of the camera, comprising:
    (a) an annular piezoelectric bender including one or more annular sheets of piezoelectric plastic material, said annular bender having outside edges and an inside edge, and electrode means disposed on the surfaces of said sheet for creating an electric field across the thickness thereof;
    (b) means for rigidly securing a portion near the outside edge of said annular bender with respect to the camera such that the plane of said annular bender is substantially perpendicular to the optical axis of the camera;

(c) means for establishing electrical contact with said electrode means; and (d) means for flexibly attaching the movable lens element to the inside edge of said annular bender such that the optical axis of said lens element is substantially coaxial with the optical axis of the camera, whereby when an electric field is applied across said sheet of piezoelectric plastic material, said bender causes said movable lens element to be displaced in a direction along its optical axis.

2. The invention claimed in claim 1 wherein said annular piezoelectric plastic bender is composed of two oppositely poled sheets of polyvinylidene fluoride ($PVF_2$) bonded together to form a sandwich and having electrodes disposed on the outside surfaces of the sandwich, and said means for establishing electrical contact as well as said means for rigidly securing said outside edge portion of said bender comprise a pair of concentric conducting rings, between which a portion of the annular bender near the outer edge thereof is clamped.

3. The invention claimed is claim 1 wherein said movable lens element is carried in a lens barrel and wherein said means for flexibly attaching said lens element comprises a bead of silicone rubber glue between the inside edge of said annular bender and said lens barrel.

4. Lens moving apparatus for a photographic camera, comprising: annular piezoelectric bender means of piezoelectric plastic material coupled between the lens and the camera for moving the lens in response to a voltage applied to said bender means.

* * * * *